United States Patent [19]
Parr

[11] Patent Number: 5,287,374
[45] Date of Patent: Feb. 15, 1994

[54] IDENTIFICATION OF ENCODER TYPE THROUGH OBSERVATION OF DATA RECEIVED

[75] Inventor: Michael I. Parr, San Diego, Calif.

[73] Assignee: Hughes Aircraft Company, Los Angeles, Calif.

[21] Appl. No.: 876,319

[22] Filed: Apr. 30, 1992

[51] Int. Cl.⁵ .................... G06F 11/10; H03M 13/12; H03D 1/00; H04L 27/06
[52] U.S. Cl. ........................................ 371/43; 371/46; 375/96
[58] Field of Search ...................... 371/43, 46; 370/83; 375/10, 75, 96, 94, 116; 455/67.1, 67.3, 115, 226.1

[56] References Cited

U.S. PATENT DOCUMENTS

| | | | |
|---|---|---|---|
| 3,919,479 | 11/1975 | Moon et al. | 455/226.1 |
| 4,710,957 | 12/1987 | Bocci et al. | 375/94 |
| 4,847,868 | 7/1989 | Hedberg et al. | 455/226.1 |
| 4,885,689 | 12/1989 | Kane et al. | . |
| 5,048,015 | 9/1991 | Zilberfarb | 375/10 |
| 5,052,000 | 9/1991 | Wang et al. | 371/43 |

*Primary Examiner*—Curtis Kuntz
*Assistant Examiner*—Duane Kobayashi
*Attorney, Agent, or Firm*—Gordon R. Lindeen, III; William J. Streeter; Wanda Denson-Low

[57] ABSTRACT

A receiver for use in digital cellular communication systems determines the type of data transmitted without having to decode the data. Digital cellular communication systems typically use convolutional forward error correction (FEC) coding to allow for error detection and correction at the receiver. The type of encoding is different depending on whether voice data or control data is transmitted. In general, FEC coding is a redundant coding of the encoded data so that for a given encoding algorithm with FEC coding, there will be a limited number of valid code sequences less than the total possible number of code sequences for a transmission of the same number of bits. This characteristic is used to identify the type of encoding without decoding the received information. Consequently, decoding requirements are reduced to those corresponding to the active transmitting encoder, resulting in receiver complexity reduction.

12 Claims, 4 Drawing Sheets

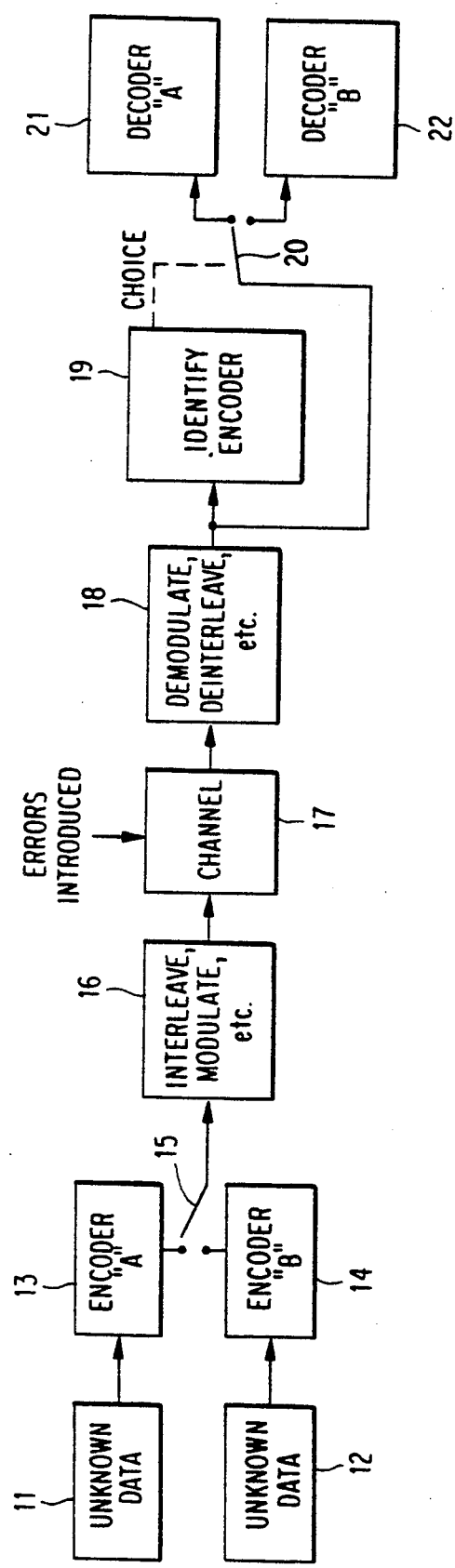

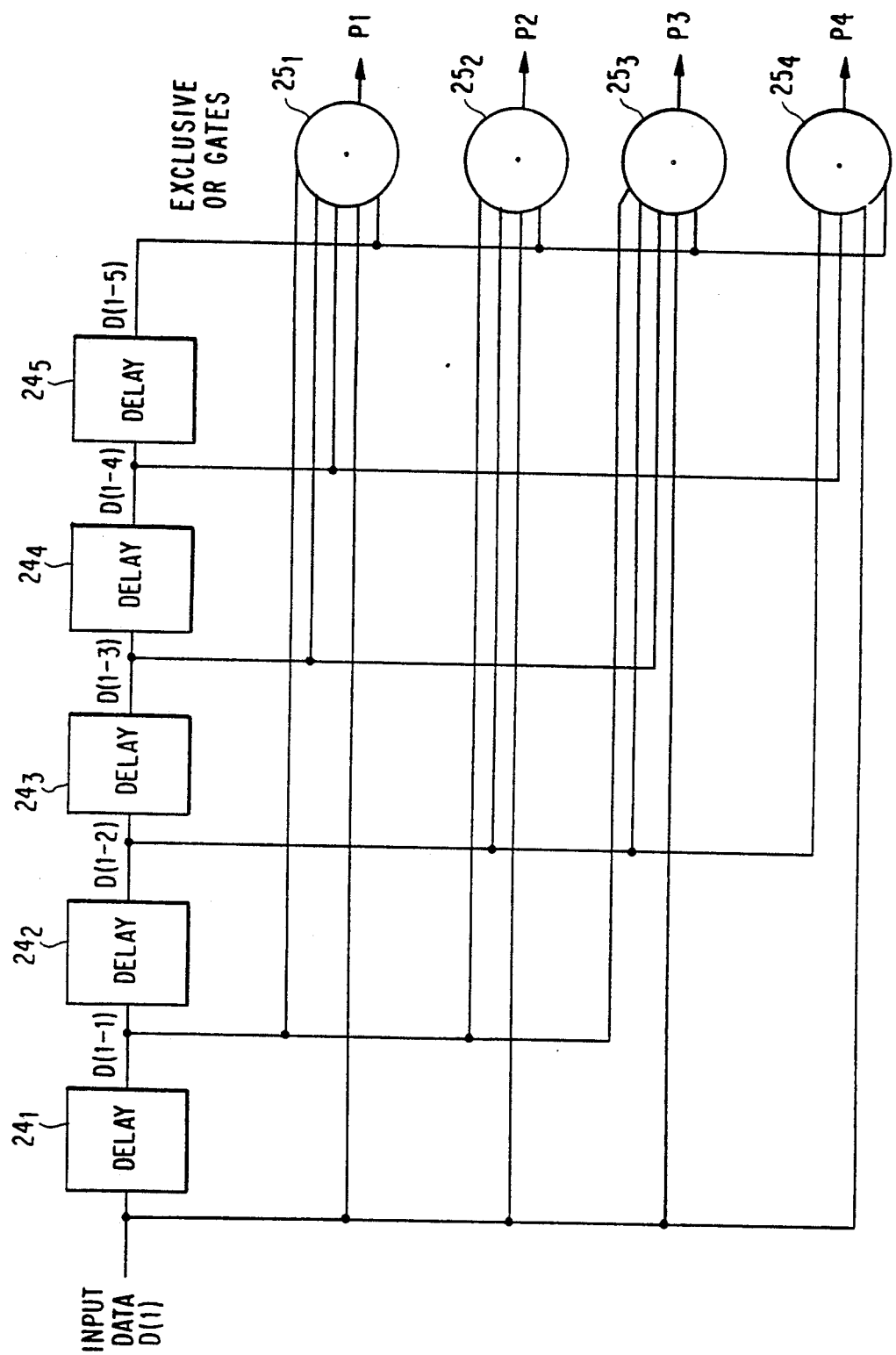

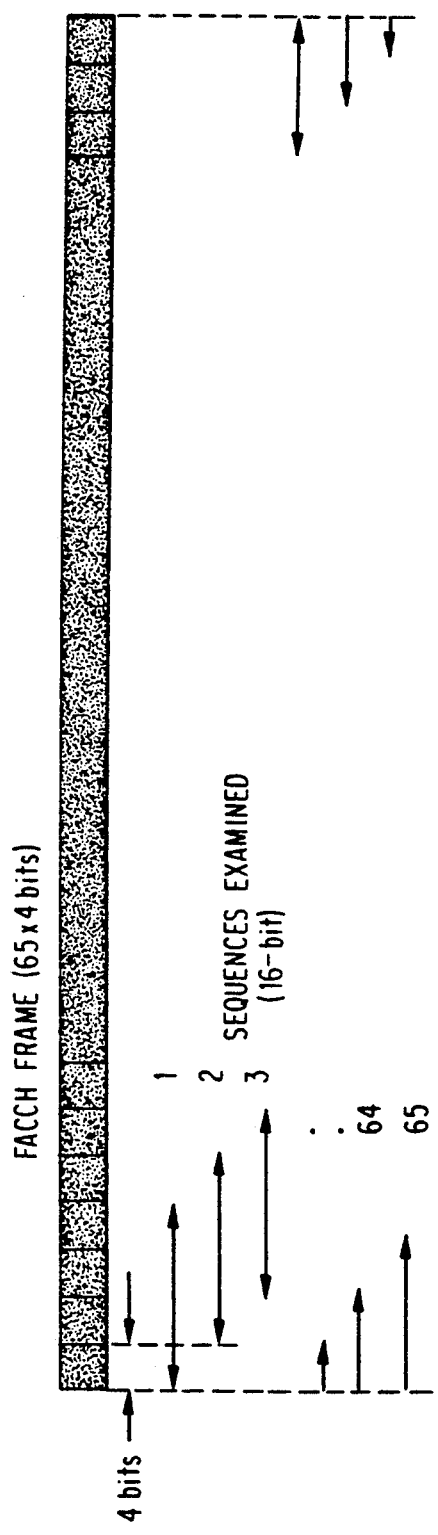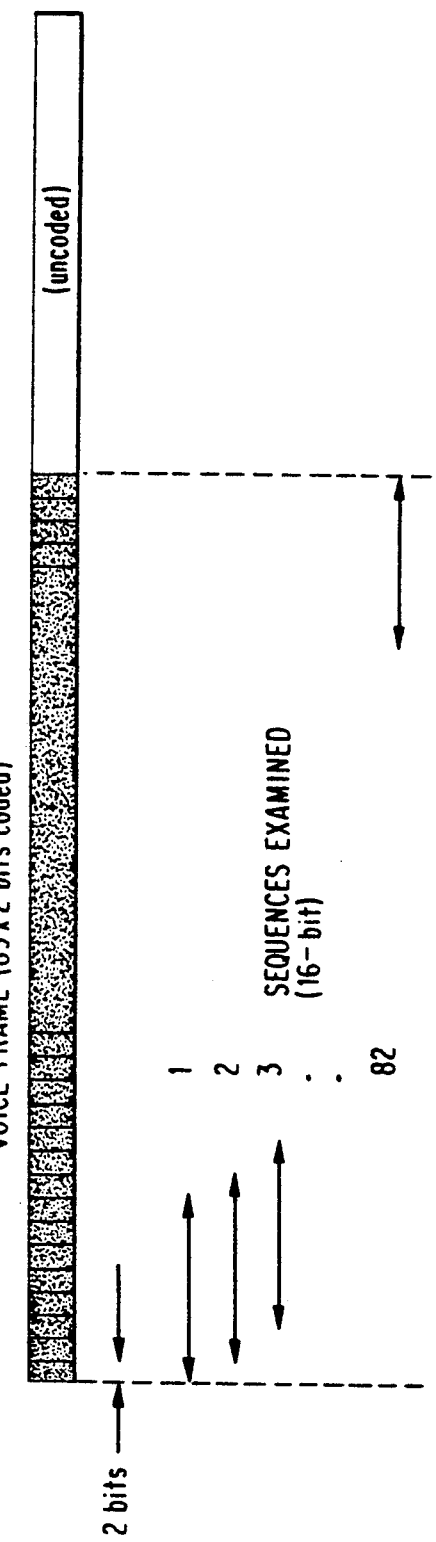

IDENTIFICATION OF ENCODER TYPE THROUGH OBSERVATION OF DATA RECEIVED

BACKGROUND OF THE INVENTION

1. Field of the Invention

The present invention generally relates to digital communication systems and, more particularly, to complexity reduction in the implementation of receiver equipment for such communication systems.

2. Description of the Prior Art

For the particular case of North American digital cellular communications, either of two information types can be transmitted. The receiver must determine the type, and this selection is not assisted by any external flagging information. The two data types, corresponding to compressed voice information (voice) and control information (FACCH) are encoded with different convolutional forward error correction codes. "FACCH" is the acronym for "Fast Associated Control Channel" from "Dual-Mode Mobile Station - Base Station Compatibility Standard", EIA/TIA Project Number 2215, Interim Standard 54, December 1989. One method of overcoming the ambiguity as to which type of data was transmitted is to separately decode received information under both hypotheses and then determine the more consistent hypothesis by examining both sets of decoded data. This approach is wasteful of resources in that the results of one of the decoding processes are never used.

SUMMARY OF THE INVENTION

It is therefore an object of the present invention to provide a receiver for use in digital cellular communication systems which determines the type of data transmitted without having to decode the data.

Digital cellular communication systems typically use convolutional forward error correction (FEC) coding to allow for error detection and correction at the receiver. In general, FEC coding is a redundant coding of the encoded data so that for a given encoding algorithm, there will be a limited number of valid code sequences less than the total possible number of code sequences for a transmission of the same number of bits. The invention takes advantage of this characteristic to identify the type of encoding without decoding the received information. The type of encoding is different depending on whether voice data or FACCH data is transmitted, resulting in code sequences that provide a positive identification of the type of data transmitted. Since there will be only a limited number of valid output sequences less than the total number of possible combinations, code sequences extracted from the recovered encoded data may be quickly compared with the valid sequences for each type to identify the type of data transmitted.

In the preferred embodiment of the invention, the determination is done by storing the valid sequences for each hypothetical encoder in tables. Data received from a channel is then examined to assess conformity to each hypothetical encoder's output and thus identify the encoder.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a block diagram of a communication system in which the encoder identifier according to the invention is implemented;

FIG. 2 is a block diagram of a conventional rate-$\frac{1}{4}$ convolutional coder;

FIGS. 3A and 3B are diagrams respectively illustrating burst formats for an FACCH frame and a voice frame;

DETAILED DESCRIPTION OF A PREFERRED EMBODIMENT OF THE INVENTION

Figure 4:
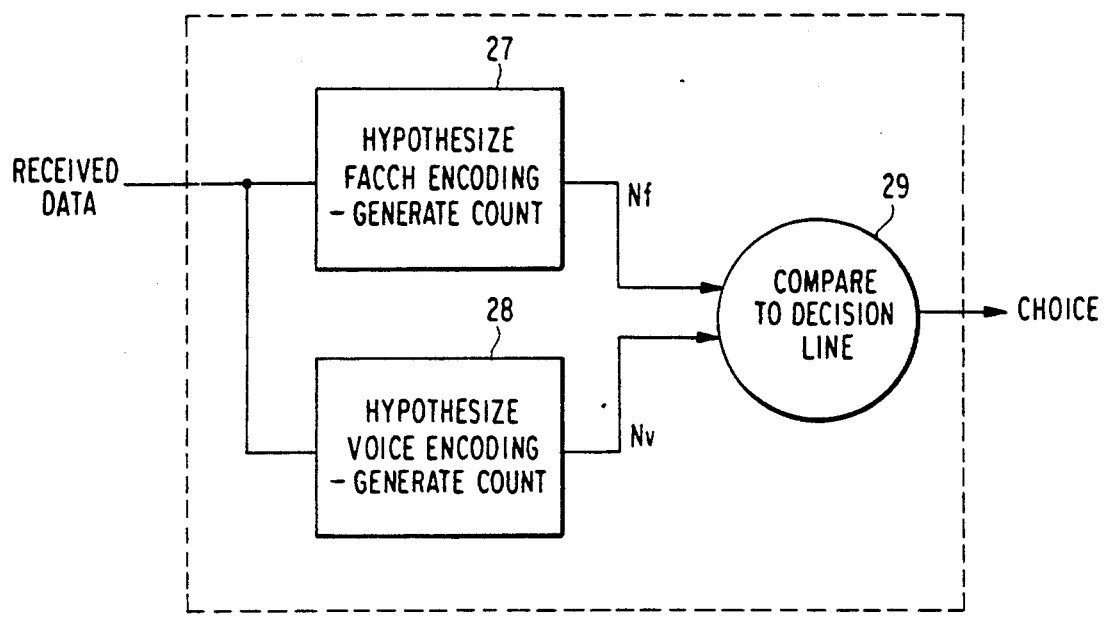
FIG. 4 is a block diagram showing processes applied in the identification of the encoder according to the invention.

Referring now to the drawings, and more particularly to FIG. 1, there is shown a communication system within which this invention might operate. Two sources of unknown data 11 and 12 are applied to respective encoders 13 and 14. An output of one of the encoders 13 and 14 is selected by switch 15 and applied to transmitter 16. The transmitter 16 modulates a local carrier signal with the output of the selected encoder and amplifies the modulated signal which is transmitted over a channel 17. The channel 17, which is typically wireless, introduces errors in the transmitted signal which must be detected and corrected at the receiver. The receiver comprises a demodulator 18 which demodulates the transmitted signal to provide at its output the encoded signal at baseband. The thus recovered encoded signal, with errors, is applied to the encoder identifying circuit 19 and to switch 20. The encoder identifying circuit 19 observes the recovered encoded signal in order to identify which encoder, 13 or 14, was used to encode the transmitted signal. Based on this observation, the circuit 19 controls switch 20 to direct the recovered encoded signal to one of the two decoders 21 or 22.

When data is encoded in a transmitter in a communication system of this type, redundancy is introduced into the resulting transmitted sequence by the convolutional forward error correction (FEC) coding. Of all the possible bit combinations that might be generated by encoders, only a subset actually emerge. Examining a number of bits at the output of an unknown encoder then testing whether the observed sequence could have been generated by a particular encoder provides a clue as to the encoder's form. If the number of possible encoders is constrained, as in the case illustrated in FIG. 1, then the form of the encoder actually used may be estimated by examining a sufficient number of encoded sequences. The effectiveness of this approach is limited by the errors that are introduced during transmission and the degree to which the encoding alternatives differ from one another.

For digital cellular, two possible encoding algorithms, FACCH and voice, may be applied to the transmitted data, set out in the EIA/TIA Project Number 2215, Interim Standard, supra. Although these two algorithms both use constraint length-6 convolutional coding, the differences in code rate, bit arrangement, and generating function ensure that encoded bits of each type appear uncorrelated with respect to the other's decoder. That is, the output of either encoder looks essentially like random data to the other's decoder.

In order to illustrate the underlying property of the encoding process exploited by this invention, consider a rate-¼ coder, as used in digital cellular, under all combinations of initial state and two consecutive input data bits. FIG. 2 shows the form of the encoder. Input data is applied to a cascaded string of delays $24_1$ to $24_5$. The input data is also applied to each of Exclusive OR gates $25_1$ to $25_4$. In addition, Exclusive OR gate $25_1$ receives as inputs the outputs of delays $24_1$, $24_3$, $24_4$, and $24_5$. Exclusive OR gate $25_2$ also receives as inputs the outputs of delays $24_1$, $24_2$ and $24_5$. Exclusive OR gate $25_3$ also receives as inputs the outputs of delays $24_1$, $24_2$, $24_3$, and $24_5$. Exclusive OR gate $25_4$ also receives as inputs the outputs of delays $24_2$, $24_4$ and $24_5$. At the output of the encoder, four bits ($P_1$–$P_4$) will emerge from Exclusive OR gates $25_1$ to $25_4$ for each input bit. After two input bits, therefore, eight bits will have been generated. If the occurrence of each 8-bit sequence is recorded over all conditions, only 128 of the 256 possible combinations will ever emerge. Extending the sequence length examined from eight bits to twelve bits reduces the proportion of valid sequences from one half to one sixteenth.

To be more definitive, the limit to the number of sequences that can emerge from an encoder can be explained as follows. Over a selected period, B bits, say, enter the encoder. If the code rate is 1/C, then B·C bits will emerge from the encoder. In addition, assume that the encoder (due to its memory) could have been in one of D states before the data was input. The total number of combinations of inputs and initial states, therefore is $2^B \cdot D$, which is also the number of possible combinations of output bits, assuming that no exactly similar patterns emerge. Thus, out of the $2^{B \cdot C}$ potential combinations of output bits, only $2^B \cdot D$ could actually emerge. Table 1 illustrates the limitations to the number of sequences generated for a number of cases.

TABLE 1

| | Limits to Number of Sequences Generated Sequence Characteristics | | | |
|---|---|---|---|---|
| B (input bits) | C (1/code rate) | Sequence Length (bits) | D (states) | $2^B \cdot D / 2^{B \cdot C}$ |
| 2 | 4 | 8 | 32 | 1/2 |
| 3 | 4 | 12 | 32 | 1/16 |
| 4 | 4 | 16 | 32 | 1/128 |
| 7 | 2 | 14 | 32 | 1/4 |
| 8 | 2 | 16 | 32 | 1/8 |

The key idea in identifying an encoder, therefore, is to know which are the valid sequences for each hypothetical encoder. By storing lists of valid sequences in tables, data actually received from a channel can be examined to assess conformity to each hypothetical encoder's output and, thus, to identify the encoder.

The preferred embodiment of the invention is implemented for the case of North American digital cellular in which FACCH bursts are to be distinguished from voice bursts. Various implementations are possible where trade-offs are made primarily between performance and the size of tables required for implementation, although the tables involved exhibit some consistency of form and can be compressed significantly. For the implementation disclosed, the hypothesis that FACCH was transmitted is evaluated using 16-bit sequences, and the hypothesis that voice was transmitted is evaluated also using 16-bit sequences. FIGS. 3A and 3B illustrates the data examined under each hypothesis when appropriately formatted.

FACCH messages, as illustrated in FIG. 3A, are transmitted with sixty-five bits in each burst, and these bursts are coded without tail bits. As such, the encoder's state for the final bit encoded is the predecessor state for the first bit encoded; i.e., encoding occurs in a circular fashion. The number of 16-bit sequences examined, therefore, is sixty-five. The sequences begin every four bits into the received data stream, starting with the first bit (bits 1 –16), then the fifth bits (5–20), etc., until the 257th bit (bits 257–260 and 1–12).

As shown in FIG. 3B, only a subset of voice information is encoded, and tail bits are used. Thus, for some portion of the transmitted data, the state is guaranteed a priori to be limited to subsets of the full range (thirty-two possible) and, thus, the corresponding combinations of bits out of the encoder may be more limited than in general. This characteristic is not exploited in this implementation. The total number of encoded bits is 178. Therefore, taking 16-bit sequences starting every two bits, there are a total of eighty-two sequences available for observation. Without tail-biting, there is no opportunity for wrap-around at the end of the burst.

Of the 65,536 potential bit combinations for the 16-bit FACCH sequences, 512 are valid, i.e., one out of 128. For the 16-bit voice sequences, 8192 are valid, i.e., one in eight. Implementation of the identification algorithm involves the process depicted in FIG. 4 which shows the functional block diagram of the identity encoder circuit 19 shown in FIG. 1. Under the hypothesis that FACCH data was transmitted, a count of the number of conforming 16-bit sequences is made and recorded, as $N_f$, by FACCH encoding counter 27. This count will lie in the range $0 \leq N_f \leq 65$, denoted 0:65. Under the hypothesis that voice data was transmitted, the number of conforming 16-bit sequences is recorded as $N_v$, by voice encoding counter 28. This count will lie in the range 0:82.

Figure 5:
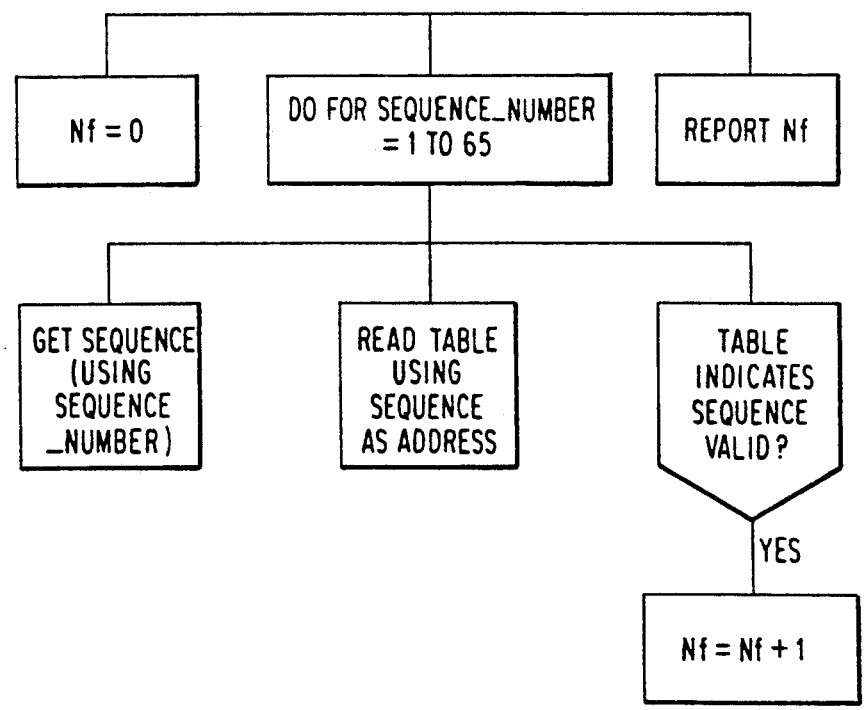
FIG. 5 is a flow diagram illustrating the logic of a valid sequence count for the FACCH hypothesis.

FIG. 5 illustrates the process of performing the FACCH count $N_f$. The count of valid sequence matches, $N_f$, is initialized by task 31. Then for each received sequence, controlled by task 32, the sequences are examined. Task 33 extracts the sequence from the received bit stream. Task 34 reads a table identifying sequence conformity, and tasks 35 and 36 increment the value of $N_f$ if the sequence is valid. Finally, task 37 reports the resulting total count, $N_f$. The process of performing the voice count $N_v$ is similar. That is, with reference to FIG. 5, substitute $N_v$ for $N_f$ and 82 for 65.

Returning now to FIG. 4 and given the counts $N_f$ and $N_v$, another table is used by comparator 29 to decide in which of the two possible regions in the two-dimensional space (0:65, 0:82) the current input lies, and thus a decision is made. This table is of length sixty-six and simply defines a threshold $N_v$ for each possible $N_f$ above which the hypothesis that voice was transmitted would be selected.

For the encoder identification technique according to the invention to have value, it must operate with a high probability of success for all conditions in which either FACCH or voice might be received correctly. That is, overall success in decoding must not be significantly impeded by erroneous determinations. Uncorrelated bit errors provide the greatest challenge to the identification scheme. The method depends on error free reception of sequences of raw channel bits with lengths of, for example, sixteen bits. At error rates of 10%, 20% or higher, this becomes a low probability event. For example, with an error rate of 20%, the probability of all sixteen bits being received correctly is less than 3%. Distinguishing whether or not the bits exhibit known patterns, therefore, becomes difficult, and high confidence depends on the availability of numerous samples.

Fading conditions, where errors are correlated, on the other hand, ensure that bit errors are concentrated in bursts. As such, while a number of sequences typically are very corrupted, for the same overall error rate, there is a higher probability that more sequences will be received without error. In the case of digital cellular, very low increments in successful burst decoding rates occur over the full range of uncorrelated error rates. For error rates in the range specified for conformance to Telecommunications Industry Association (TIA) standards, the increments in failure rates are negligible.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A receiver for use in communication systems in which data may be encoded with any one of a plurality of encoding algorithms, encoded data having only a limited number of valid sequences less than a total number of possible combinations for a given input bit pattern, said receiver comprising:
   demodulator means for recovering a transmitted encoded data stream;
   a plurality of decoders, one for each of said plurality of encoding algorithms;
   switch means for selectively directing said encoded data stream from said demodulator means to one of said plurality of decoders; and
   control means responsive to said encoded data stream for determining the type of data transmitted without decoding the data by examining code patterns and comparing with valid code patterns for each of said plurality of encoding algorithms and controlling said switch means depending on which of said plurality of encoding algorithms was used to encode transmitted data.

2. The receiver recited in claim 1 wherein said plurality of encoding algorithms generate convolutional codes wherein differences in code rate, bit arrangement, and generating function ensure that encoded bits of each type appear uncorrelated with respect to the decoders for others of said plurality of encoding algorithms.

3. The receiver recited in claim 2 wherein said control means comprises:
   a plurality of counting means, one for each of said plurality of encoding algorithms, said counting means each counting valid sequences extracted from said encoded data stream; and
   decision means responsive to counts accumulated by each of said plurality of counting means for determining which of said plurality of encoding algorithms was used to encode the transmitted data.

4. A receiver for use in digital cellular communication systems in which voice and control data may be encoded with any one of first or second encoding algorithms, encoded data having only a limited number of valid sequences less than a total number of possible combinations for a given input bit pattern, said receiver comprising:
   demodulator means for recovering a transmitted encoded data stream;
   first and second decoders, one for voice data and one for control data;
   switch means for selectively directing said encoded data stream from said demodulator means to said first or second decoders; and
   control means responsive to said encoded data stream for determining the type of data transmitted without decoding the data by examining code patterns and comparing with valid code patterns and controlling said switch means depending on whether voice data or control data is transmitted.

5. The receiver recited in claim 4 wherein said control means comprises:
   first and second counting means, said first counting means counting a number, $N_v$, of valid sequences for voice data extracted from said recovered encoded data stream and said second counting means counting a number, $N_f$, of valid sequences for control data extracted from said recovered encoded data stream; and
   decision means responsive to counts accumulated by each of first and second counting means for determining whether voice or control data was transmitted.

6. A method for determining the type of data transmitted in a communication system without decoding the data in which the data may be encoded with any one of a plurality of encoding algorithms, said plurality of encoding algorithms generating convolutional codes wherein differences in code rate, bit arrangement, and generating function ensure that encoded bits of each type appear uncorrelated with respect to the decoders for others of said plurality of encoding algorithms and encoded data having only a limited number of valid sequences less than a total number of possible combinations for a given input bit pattern, said method comprising the steps of:
   recovering a transmitted encoded data stream by demodulating a received modulated signal;
   extracting code sequences from the recovered encoded data stream;
   counting, for each of said plurality of encoding algorithms, valid sequences extracted from the recovered encoded data stream;
   examining numbers of valid sequences counted for each of said plurality of encoding algorithms; and
   determining from the examined numbers of valid sequences which of said plurality of encoding algorithms was used to encode the transmitted data.

7. The method recited in claim 6 wherein said step of counting is performed by the steps of:
   comparing extracted sequences with tables of valid sequences for each of said plurality of encoding algorithms; and
   advancing a count corresponding to one of said tables for each valid sequence found in said table.

8. A receiver for use in communication systems in which data may be encoded with any one of a plurality of encoding algorithms, encoded data having only a limited number of valid sequences less than a total number of possible combinations for a given input bit pattern, said receiver comprising:
   a demodulator recovering a transmitted encoded data stream;
   a plurality of decoders, one for each of said plurality of encoding algorithms;

a switch selectively directing said encoded data stream from said demodulator to one of said plurality of decoders; and a controller responsive to said encoded data stream to determine the type of data transmitted without decoding the data by examining code patterns and comparing with valid code patterns for each of said plurality of encoding algorithms and controlling said switch depending on which of said plurality of encoding algorithms was used to encode transmitted data.

9. The receiver recited in claim 8 wherein said plurality of encoding algorithms generate convolutional codes wherein differences in code rate, bit arrangement, and generating function ensure that encoded bits of each type appear uncorrelated with respect to the decoders for others of said plurality of encoding algorithms.

10. The receiver recited in claim 9 wherein said controller comprises:

a plurality of counters, one for each of said plurality of encoding algorithms, each of said counters counting valid sequences extracted from said encoded data stream; and a processor responsive to counts accumulated by each of said plurality of counters for determining which of said plurality of encoding algorithms was used to encode the transmitted data.

11. A receiver for use in digital cellular communication systems in which voice and control data may be encoded with any one of first or second encoding algorithms, encoded data having only a limited number of valid sequences less than a total number of possible combinations for a given input bit pattern, said receiver comprising:

a demodulator recovering a transmitted encoded data stream;

first and second decoders, one for voice data and one for control data;

a switch selectively directing said encoded data stream from said demodulator to said first or second decoders; and a controller responsive to said encoded data stream for determining the type of data transmitted without decoding the data by examining code patterns and comparing with valid code patterns and controlling said switch means depending on whether voice data or control data is transmitted.

12. The receiver recited in claim 11 wherein said controller comprises:

first and second counters, said first counter counting a number, $N_v$, of valid sequences for voice data extracted from said encoded data stream and said second counter counting a number, $N_f$, of valid sequences for control data extracted from said encoded data stream; and a processor responsive to counts accumulated by each of first and second counters for determining whether voice or control data was transmitted.

* * * * *